(12) United States Patent
Goh et al.

(10) Patent No.: US 9,958,502 B2
(45) Date of Patent: *May 1, 2018

(54) DEFECT ISOLATION METHODS AND SYSTEMS

(71) Applicant: GLOBALFOUNDRIES Singapore Pte. Ltd., Singapore (SG)

(72) Inventors: Szu Huat Goh, Singapore (SG); Yin Hong Chan, Gelugor (MY); Boon Lian Yeoh, Teluk Intan (MY); Jeffrey Chor Keung Lam, Singapore (SG); Lin Zhao, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 3 days.

This patent is subject to a terminal disclaimer.

(21) Appl. No.: 15/045,276

(22) Filed: Feb. 17, 2016

(65) Prior Publication Data

US 2016/0161556 A1 Jun. 9, 2016

Related U.S. Application Data

(63) Continuation-in-part of application No. 14/824,104, filed on Aug. 12, 2015.
(Continued)

(51) Int. Cl.
*G01R 17/16* (2006.01)
*G01R 31/311* (2006.01)

(52) U.S. Cl.
CPC ................ *G01R 31/311* (2013.01)

(58) Field of Classification Search
CPC .. G01R 17/105; G01R 17/16; G01R 19/0084; G01R 19/16528; G01R 19/16552;
(Continued)

(56) References Cited

U.S. PATENT DOCUMENTS 6,308,290 B1 10/2001 Forlenza et al.
6,549,022 B1 4/2003 Cole, Jr. et al.
(Continued)

OTHER PUBLICATIONS

M.R.Bruce et al., "Soft Defect Localization (SDL) on ICs", Proceedings of the 28th International Symposium for Testing and Failure Analysis (ASM International), Oct. 2002, pp. 21-27, ISTFA.
(Continued)

*Primary Examiner* — Jermele M Hollington
*Assistant Examiner* — Taqi Nasir
(74) *Attorney, Agent, or Firm* — Horizon IP PTE LTD.

(57) ABSTRACT

A test system for testing devices is disclosed. The test system includes a scanning microscope module and a test module. The scanning microscope module, when testing a device under test (DUT), is configured to perturb the DUT with a laser at a test (pixel) location. The test module includes a tester unit, a reference failure log containing prior failing compare vectors of interest, and a comparator unit which includes a software comparator. The tester unit is configured to perform a test run at the test location of the DUT with a test pattern. If the test run fails testing, the tester unit is configured to compare using the comparator unit to determine if failing test vectors of the test run matches a desired failure signature, and to generate a comparator trigger pulse if failing test vectors match the prior failure signature. The trigger pulse indicates that the test location of the DUT is a failed location.

20 Claims, 16 Drawing Sheets

Related U.S. Application Data

(60) Provisional application No. 62/036,128, filed on Aug. 12, 2014, provisional application No. 62/184,262, filed on Jun. 25, 2015.

(58) Field of Classification Search
CPC .............. G01R 19/16571; G01R 1/073; G01R 1/07307; G01R 1/07342; G01R 1/0735; G01R 1/24; G01R 23/02; G01R 27/08; G01R 27/205; G01R 27/2605; G01R 29/24; G01R 31/006; G01R 31/007
USPC ................. 324/752, 754.23, 762.01–762.09, 324/763.01–763.02, 719, 757.02
See application file for complete search history.

(56) References Cited

U.S. PATENT DOCUMENTS

| 7,733,100 | B2* | 6/2010 | Kasapi | G01R 31/308 324/754.22 |
|---|---|---|---|---|
| 8,754,633 | B2* | 6/2014 | Ng | G01R 31/311 324/97 |
| 9,000,790 | B2* | 4/2015 | Celi | G01R 31/311 324/754.23 |
| 9,324,304 | B2* | 4/2016 | Sugita | G06T 7/001 |
| 2006/0066325 | A1* | 3/2006 | McGinnis | G01R 31/311 324/754.23 |
| 2008/0301597 | A1* | 12/2008 | Chen | G01R 31/2894 716/136 |
| 2009/0271675 | A1* | 10/2009 | Dickson | G01R 31/311 714/732 |
| 2010/0095276 | A1* | 4/2010 | Ottavi | G06F 11/3664 717/125 |

OTHER PUBLICATIONS

Christian Burmer et al., "Soft Defects: Challenge and Chance for Failure Analysis", Physical and Failure Analysis of Integrated Circuits, 14th International Symposium on the, 2007, IEEE.
Jeremy Rowlette et al., "Critical Timing Analysis in Microprocessors Using Near-IR Laser Assisted Device Alteration (LADA)", ITC International Test Conference, Jan. 2003, vol. 1, pp. 264-273, IEEE.

* cited by examiner

DEFECT ISOLATION METHODS AND SYSTEMS

CROSS-REFERENCE TO RELATED APPLICATIONS

This application is a continuation-in-part application of co-pending U.S. patent application Ser. No. 14/824,104, filed on Aug. 12, 2015, entitled "Defect Isolation Methods and Systems", which relies on priority of Provisional Application No. 62/036,128 entitled "Precision of tester-based laser-assisted defect localization" filed on Aug. 12, 2014 and U.S. Provisional Application No. 62/184,262 entitled "Electrically enhanced Laser Assisted Device Alteration (Ee-LADA) for Integrated Circuits Defect Localization" filed on Jun. 25, 2015, the disclosures of which are herein incorporated by reference in their entireties for all purposes.

BACKGROUND

Integrated circuits (ICs) may include billions of transistors designed as logic circuitries which perform specific functions. After manufacturing, functionality of the ICs are tested using for example, IC testers. A failure event triggers a failure analysis flow to identify causation of the failure. For example, the failure analysis flow debugs the failures.

An important aspect of debugging is defect localization, such as hot spots. However, conventional IC testers generate large amount of artifacts (false hot spots) along with the hot spots. The large number of artifacts increases the amount of time for debugging the failure. This negatively impacts product yield ramp, decreasing profit margin.

From the foregoing discussion, it is desirable to improve defect localization.

SUMMARY

Embodiments generally relate to a defect localization in ICs. In one embodiment, a test system for testing devices is disclosed. The test system includes a scanning microscope module and a test module. The scanning microscope module, when testing a device under test (DUT), is configured to perturb the DUT with a laser at a test (pixel) location. The test module includes a tester (or tester unit), a reference failure log containing prior failing compare vectors of interest, and a comparator unit which includes a software comparator. The tester unit is configured to perform a test run at the test location of the DUT with a test pattern. If the test run fails testing, the tester unit is configured to compare using the comparator unit to determine if failing test vectors of the test run matches a desired failure signature, and to generate a comparator trigger pulse if failing test vectors match the prior failure signature. The trigger pulse indicates that the test location of the DUT is a failed location.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which.

DETAILED DESCRIPTION

Embodiments generally relate to devices, for example, semiconductor devices or integrated circuits (ICs). More particularly, embodiments relate to testing or analyzing devices or ICs in the manufacturing process to localize defects. Defect localization is facilitated by a laser assisted device alteration (LADA) analysis system. The ICs tested can be any type of IC, such as dynamic or static random access memories, signal processors, microcontrollers or system-on-chip (SoC) devices. Other types of devices may also be useful. The devices or ICs can be incorporated into or used with, for example, consumer electronic products, or other types of products.

Figure 1:
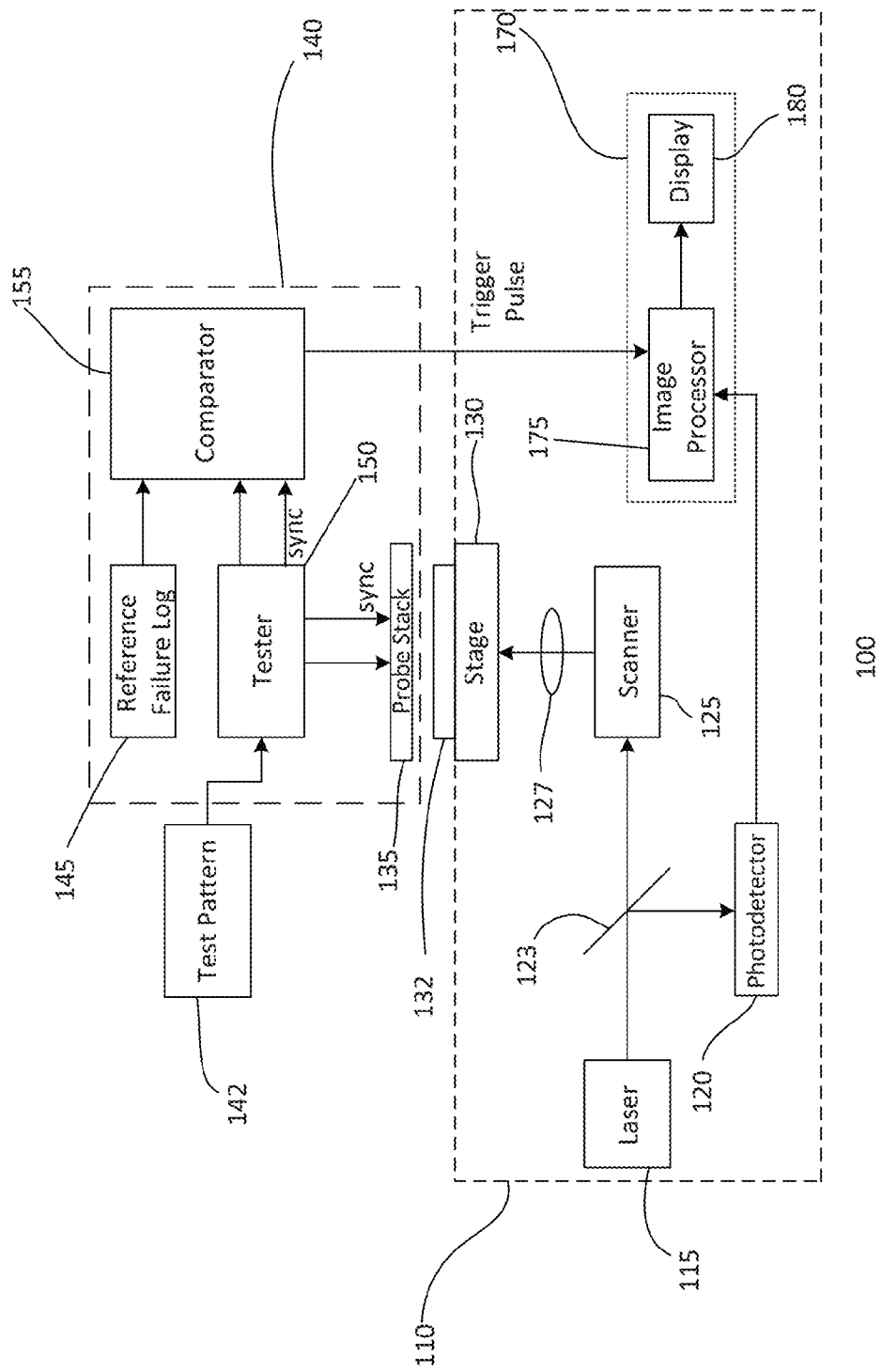
FIGS. 1, 2 and 3a-3b show block diagrams of various embodiments of a test system for defect localization.

FIG. 1 shows a simplified block diagram of an exemplary analysis or diagnostic system 100. The analysis system facilitates defect isolation for ICs. In one embodiment, the analysis system includes a scanning microscope module 110 and a test module 140. Providing the test system with other modules may also be useful.

In one embodiment, the scanning microscope module 110 includes a laser source 115, a photodetector unit 120, a beam splitter 123, a scanner unit 125, a focusing unit 127, a test stage 130, and an imaging unit 170 with an image processor 175 and a display 180. The scanning microscope, for example, may be a commercially available laser scanning microscope. Such types of scanning microscopes may be from, for example, DCG systems, Hamamatsu, Semicaps and Checkpoint Technologies. Other types of scanning microscopes may also be useful. As for the test module 140, it includes a reference failure log 145, a tester (or tester unit) 150, a probe stack 135 and a comparator 155. The tester unit, for example, may be a commercially available tester from, for example, Advantest, Teradyne, LTX-Credence, and National Instruments. Other types of testers may also be useful. Providing the various modules with other units or components may also be useful.

The various modules are configured to analyze a device under test (DUT) 132. For example, a DUT is provided with test signals from the test module and scanned with a laser beam by the scanning microscope. The laser beam serves to perturb the DUT for testing as well as capture the DUT's image pixel-by-pixel. The image of the DUT may be displayed on the display of the imaging unit to the user.

In operation to test a device, the DUT is mounted onto the test stage 130. For example, the test stage supports the DUT for testing. In one embodiment, the DUT is an IC. The DUT may be an individual IC. For example, the DUT may be a die which has been singulated from a wafer with a plurality of ICs by dicing the wafer. Providing unsingulated dies for testing on the test stage may also be useful. The IC includes a plurality of metallization layers formed over the substrate or wafer for interconnecting circuit components, such as transistors, capacitors and resistors. The side of the IC which has the metallization layers is referred to as the "frontside" while the opposite side of the IC is referred to as the "backside".

The IC includes a plurality of pins which allow access to the internal circuitry. For example, the pins may include power and signal pins. The power pins may include various power sources, including ground while signal pins may include input/output (I/O) pins. The signal pins may be bidirectional, unidirectional or a combination thereof. The pins may be in the form of pads for an unpackaged IC. In some cases, the pins may be contact bumps, such as a wafer level packaged IC. The pads or contact bumps are disposed on the frontside of the IC. In other cases, the IC may be a fully packaged IC. In such cases, at least a part of the package is removed for access by the scanning microscope. For example, at least the side of the package which covers the backside of the die is removed to expose the backside of the die for access by the scanning microscope. Decapping to expose the backside of the die may be achieved by laser or chemical techniques.

In one embodiment, the backside of the die or IC is disposed on the surface of the test stage. For example, the stage includes a cavity for accessing by the laser for scanning and defect isolation.

The laser generates a radiation or light beam which is directed to the backside of the die. For example, the beam is focused on the backside of the die through the test stage. The wavelength of the laser beam may be from about 1000-1400 nm. Other wavelengths may also be useful. The wavelength used may depend on the type or material of the substrate of the die as well as application method. For example, the wavelength should be below the bandgap of the substrate material of the die. The laser may be configured to operate as a continuous-wave laser or a pulsed laser.

In one embodiment, the laser is configured to operate as a pulsed laser (e.g., pulse mode). Various techniques may be employed to configure the laser to operate in the pulse mode. For example, an electro-optical modulator (EOM), a mode-locker, or a laser chopper may be employed. The frequency of the pulsed beam may be from about 1 kHz to about 10 KHz or greater. Other pulse frequencies may also be useful. We have discovered that higher frequencies are preferred. For example, a pulse width of a laser beam is preferably less than 200 µs. The pulse width may be about 50 µs. Other pulse widths may also be useful. We have discovered that smaller pulse widths are preferred. In one embodiment, the duty cycle of the pulse width is about 50%. Other duty cycles may also be useful.

The system may be employed to identify soft or hard IC failures. The laser may be operated in either a continuous or a pulse mode. Other configurations of the laser for defect analysis may also be useful.

The incident laser beam is used to perturb the electrical characteristics of the transistors during testing. For example, the incident laser beam may serve as a heating source to heat the backside of the die to perturb the IC. The laser may be in continuous mode at a wavelength of around 1340 nm. To generate carriers, the laser may be in the continuous or pulse mode and the wavelength may be about 1064 nm. For example, the carrier generation can be caused by optical beam induced current (OBIC) effects.

The scanner is employed to scan the backside of the DUT with the laser beam. For example, the scanner is disposed in the path of the laser beam from the laser source and directs the beam to the backside of the DUT. The scanner, for example, may be controlled to scan the laser or laser beam in an x-y direction in the plane of the back of the DUT. Various types of scanners for scanning the laser may be used. For example, the scanner may be a step (non-continuous) or raster (continuous) scanner. The scanner, for example, scans the complete backside of the IC pixel-by-pixel. The scanner may include an output position signal which enables determination of the position of the laser beam on the backside of the die or DUT.

In one embodiment, the focusing unit, which is disposed in the beam path between the scanner and test stage, focuses the laser beam from the scanner to the backside of the IC. The focusing unit, for example, may be an optical column. For example, the focusing unit may include an objective lens for focusing the beam onto the backside of the IC. The lens may be an air gap or immersion lens. Other type of lenses or focusing units may also be useful. For example, the focusing unit may include curved mirrors. The focusing unit focuses the beam having a predetermined spot size. The spot size, for example, may be about 150-200 nm. Other spot sizes may also be useful. The spot size, for example, depends on the focal length of the lens of the focusing unit. The focal length of the lens can be selected depending on a desired resolution limit for the measurements.

The laser is also used to obtain a light image of the portion of the DUT or IC on which the beam is focused. The light image is obtained from the reflected laser beam. For example, the reflected laser beam from the backside of the DUT is sampled to obtain the image. The reflected laser beam is directed to the photodetector via the beam splitter, which is located between the laser and scanner. The photodetector unit detects the reflected beam and generates a detector output signal of the reflected image. For example, the photodetector unit detects the intensity of the reflected beam and generates a detector output signal.

The image processor processes the detector output signal and generates an image of the portion of the DUT sampled. The image, for example, is a reflected laser image of a pixel of the DUT sampled. The location of the pixel may be determined by the location output signal from the scanner. The image may be displayed on the display. For example, as each pixel of the DUT is scanned, the image may be displayed on the display in real time. The image may be stored in memory. For example, the reflected laser image may be stored in the processor's memory. The image may be stored in other storage locations. For example, the image may be stored in a server.

As discussed, a reflected laser image of the DUT may be obtained by scanning the whole DUT with the laser beam. For example, scanning the DUT pixel-by-pixel with the laser beam may be employed to generate a complete image of the DUT. In one embodiment, prior to commencing the testing, a complete image of the DUT is obtained.

As also discussed, the test module includes a reference failure log unit 145. The reference failure log unit contains prior failures of interest. The prior failures of interest, for example, are obtained from a sort test of failed ICs and logging the failing compare or test vectors. Other techniques for obtaining prior failures or failing compare vectors of interest may also be useful. In one embodiment, the failing compare vectors are test vectors of interest from the sort test pattern.

As shown, the tester unit receives a test pattern 142 for testing the DUT. The test pattern, for example, is a 3-Dimensional (3-D) matrix of test vectors corresponding to specific pin names of the IC and cycle numbers. For example, the test vectors may be pointers to a bias or a waveform table. The test vectors may include inputs and/or outputs. In the case of inputs, they serve as driving signals. In the case of outputs, also called compare test vectors, they serve as expected signals which are compared with actual outputs from the DUT corresponding to the cycle. The rising edge of the tester's clock signal may serve as a trigger when input vectors are applied or when output vectors are compared. Typically, vector/s belonging to a pin/s is/are tested per clock cycle. Testing, for example, is performed after an image of the IC is obtained from an initial scan. It is understood that the imaging and testing are separate activities performed by different tools or systems. As such, the imaging and testing may be performed concurrently or sequentially.

The probe stack 135 is mounted onto the DUT. For example, the probe stack includes electrical connections connected to pads or contacts of the IC. This enables the tester unit to communicate with the IC. For example, the probe stack facilitates test stimulus to test the IC, as well as reads the outputs from the IC for comparison with expected values.

Within a test cycle, the laser beam scans the backside of the DUT to perturb the IC one test location (pixel location) at a time until the whole DUT is tested. Testing at each location may be referred to as a complete test run of all the test vectors or test sequences of the test pattern. At each location or test run, the tester tests the IC with the test pattern. The result of the test pattern (e.g., measured or output test vector) is compared with the expected values of the test pattern to determine whether the output test vector is a failed test vector. For example, failed test vectors are output test vectors which do not match the expected values.

In one embodiment, the tester unit registers a fail when one or more output test vectors of a test run do not match the expected values during the test cycle. For example, one or more output test vectors not matching expected values results in a fail. Conversely, if all output test vectors of a test run match expected values, the tester unit registers a pass.

In the case when a test fails, the comparator compares the failed test vectors from the test run. In one embodiment, the comparator compares the failed test vectors with the reference failure log. For example, the comparator compares the failed test vectors with the reference failure log to determine if the failed test vectors match a desired failure signature. The desired failure signature, for example, is based on the reference failure log.

In one embodiment, the comparator is a programmable comparator. The comparator may be programmed to define a desired failure signature from the reference failure log. As discussed, the prior reference failure log may contain a plurality of failing compare vectors of interest. A user may define a group of the failing compare vectors of interest as the desired failure signature. The group may be any number of the failing compare vectors of interest in the prior reference failure log. For example, in the case where the prior failure reference log contains 10 failing compare vectors, the prior failure signature may contain from 1 to 10 of the failing compare vectors. In some cases, the user may define more than 1 prior failure signature. For example, the trigger signal may be generated whenever the group of failed test vectors matches a prior failure signature.

If the failed test vectors match the desired failure signature, a trigger signal is generated. For example, the comparator generates the bigger signal if the test vectors match the desired failure signature. The trigger signal, in one embodiment, is a pulse signal. The trigger signal, for example, indicates that the location tested is a failed or defect location. The trigger signal is provided to the image processor. The trigger signal causes the processor to mark the location (pixel) as a failed pixel. For example, the image processor overlays a marker at the failed location onto the image of the DUT. The marker indicates that the pixel is a failed pixel.

By enabling the user to program prior failure signatures, the testing can be tailored to filter out undesirable defect signals from desirable defect signals. For example, the stringency of the testing may be tailored by defining the desired failure signatures. The higher the number of prior failed vectors contained in the prior failure signature, the more stringent the failure detection. For example, the pixel is determined as a failed pixel only when the prior failure signature is satisfied. The more failing compare vectors in the failure signature, the more stringent the testing. For example, if the failure signature contains 10 failing compare vectors, all 10 must be detected before the defect is registered. If the testing is too stringent, no defect signals may be detected. However, if the testing is too lax, too many defect signals may be detected.

In one embodiment, the tester tests the DUT with the test pattern at each location. For example, a test run or cycle is performed at each location. During a test run, the tester tests the DUT with the test sequence of test vectors. The tester, in one embodiment, generates a test synchronization signal. The test synchronization, as shown, is provided to the scanning microscope module and the comparator unit. The test synchronization signal provides a reference to start a test run or test cycle for testing a location of the DUT. For example, the various components of the scanning microscope and test modules operate based on the test synchronization signal. The test synchronization signal takes reference from, for example, the tester clock which commences the beginning of a test pattern run and the comparator unit is initiated based on a specified delay after the test synchronization signal. The synchronization signal is provided at the beginning of each test run at each pixel location.

In one embodiment, the tester may be configured for the comparator to compare the failed test vectors after each test cycle. For example, if the tester unit detects a failure, the comparator compares the failed test vectors with the desired failure signature. A trigger signal is generated if the failed test vectors match the desired failure signature. Alternatively, the tester may be configured for the comparator to compare the failed test vectors on the fly, such as when they are detected. When the desired failure signature is detected, the trigger signal is generated.

Figure 2:
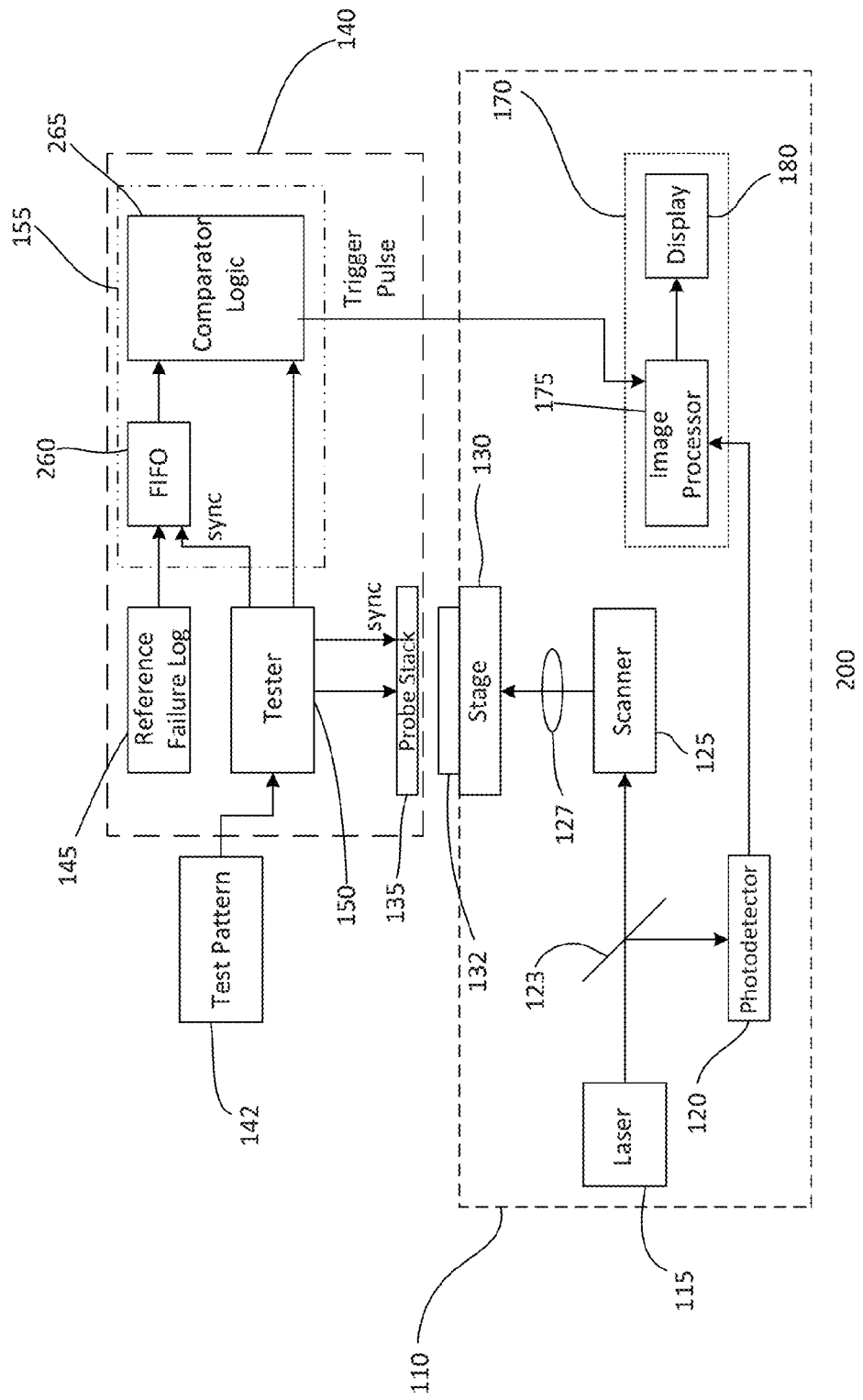

FIG. 2 shows a simplified block diagram of another analysis or test system 200. The test system is similar to the test system of FIG. 1. Common elements may not be discussed or discussed in detail. In one embodiment, the test system includes a scanning microscope module 110 and a test module 140. Providing the test system with other modules may also be useful.

In one embodiment, the comparator 155 includes a storage unit 260 and a comparator logic unit 265. The storage unit, in one embodiment, is a first in first out (FIFO) logic unit. The FIFO logic unit, for example, is a FIFO storage unit, such as a shift register or a storage array. Other types of storage units may also be useful. The FIFO storage unit is configured to store the prior failed vectors of the reference failure log. For example, the FIFO storage unit is sufficient to contain the failing compare vectors. A failing compare vector is shifted out for comparison by the comparator logic unit according to the clock cycle of the test run. The comparator logic may include an AND comparator logic. Other types of comparator logics may also be useful.

In one embodiment, the comparator logic unit includes a programmable comparator logic unit. For example, the logic unit may be programmed, as previously-discussed, to compare failed test compare vectors with a prior failure signature. For example, the comparator logic unit can be programmed to ignore comparing failing compare vectors in the prior reference failure log which are not part of the failure signature during a test run. When the cycle of a failing compare vector is tested, the shift register outputs the failing compare vector to the comparator logic unit for comparison. If the failing compare vector is part of the failure signature, it is compared with the output test vector to see if there is a defect. If not, the comparator logic unit skips comparing the failing compare vector with the output test vector. After the test run, the comparator logic unit generates a trigger pulse if the failure signature is detected.

Figure 3A:
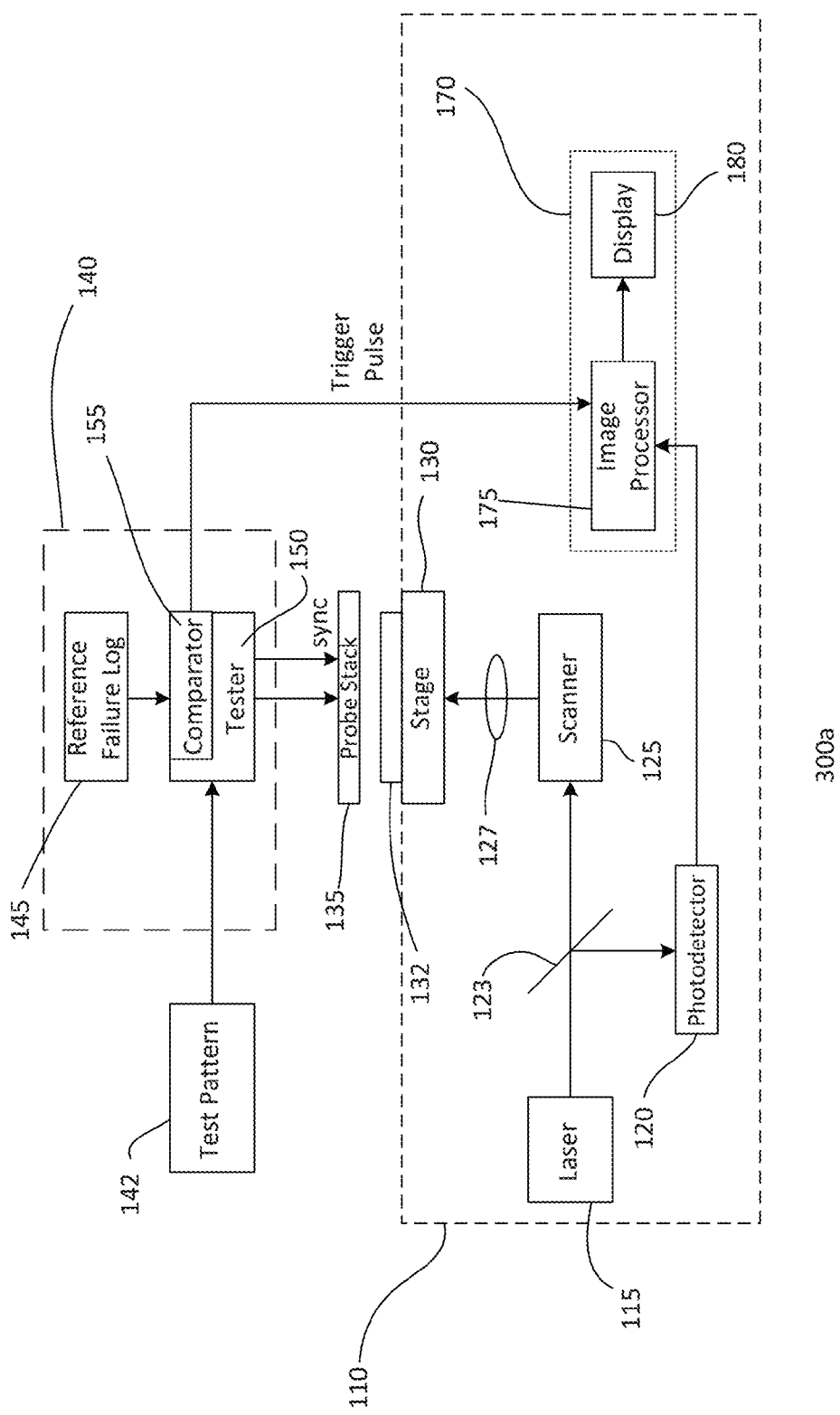

FIG. 3a shows a simplified block diagram of another analysis or test system 300a. The test system is similar to the test system of FIGS. 1-2. Common elements may not be discussed or discussed in detail. In one embodiment, the test system includes a scanning microscope module 110 and a test module 140. Providing the test system with other types of modules may also be useful.

In one embodiment, the comparator unit 155 is integrated with the tester unit. The comparator unit may a comparator unit as described in FIG. 2 with logic components which are integrated as part of the tester unit. In other embodiments, the comparator unit may be implemented as software. Other configurations of the comparator unit may also be useful. The comparator unit is configured to compare the test output vectors with the failing compare vectors of a failure signature from the reference failure log unit 145, as previously described.

In one embodiment, the comparator unit is implemented as a software comparator. For example, the tester includes a compare software or coding which is configured to instruct the processor of the tester to compare test results with prior failure log signature. For example, test results and the prior failure log signatures are stored in memory. The test results and failure log signatures are compared to determine if there is a match.

In one embodiment, the software comparator may be programmed to compare failed test vectors with a desired failure signature. For example, the software comparator can be programmed to ignore comparing failed test vectors which are not part of the failure signature during a test run.

When a failing compare vector is registered, the software comparator compares the failed test vector or vectors with the failure signature. If the failed test vectors match the failure signature, a trigger signal is generated. On the other hand, if the failed test vectors do not match the failure signature, testing continues.

The trigger signal, as previously described, is provided to the image processor. The trigger signal causes the processor to mark the location (pixel) as a failed pixel. For example, the image processor overlays a marker at the failed location onto the image of the DUT. The marker indicates that the pixel is a failed pixel.

Figure 3B:
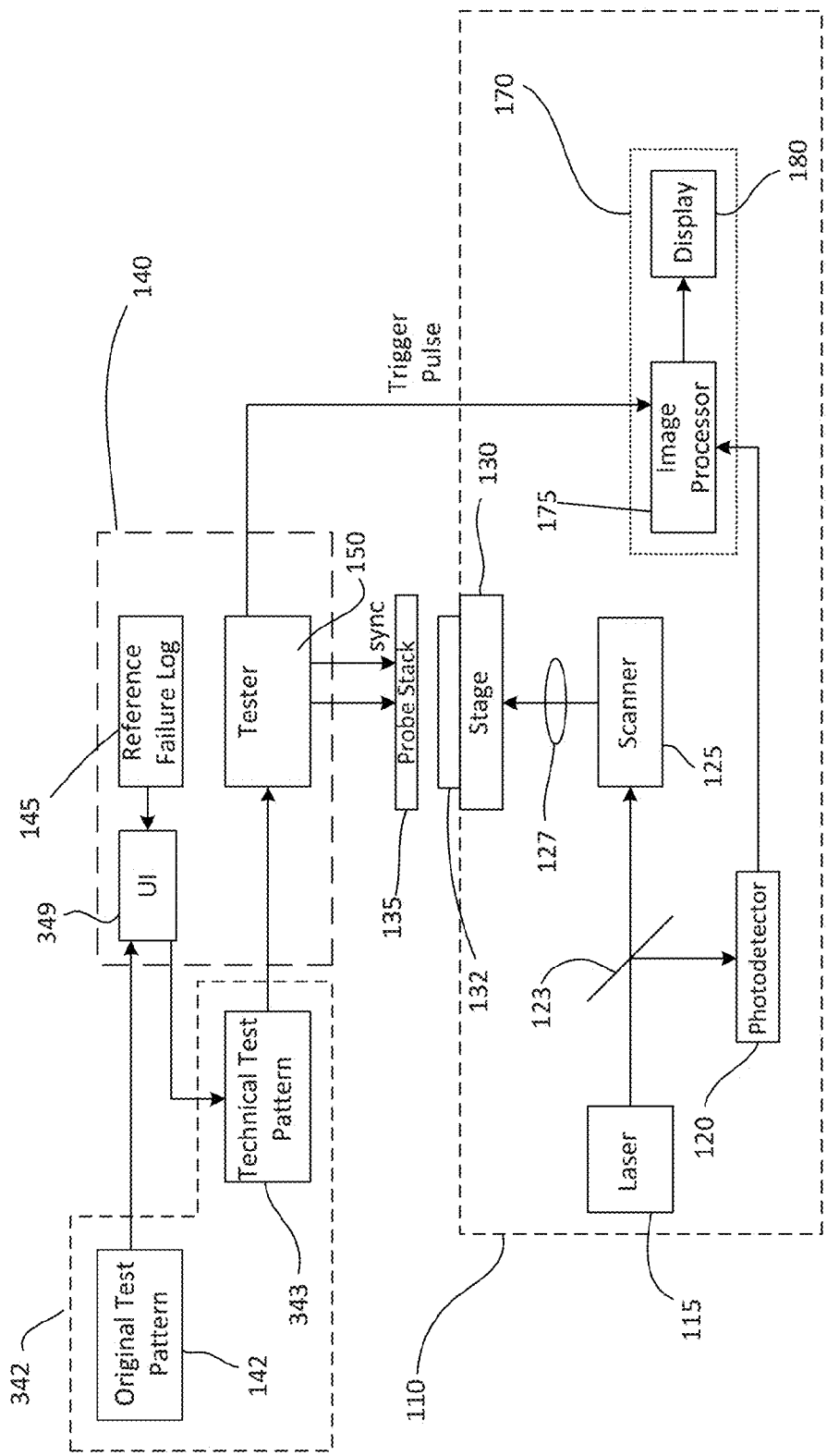

FIG. 3b shows a simplified block diagram of another analysis or test system 300b. The test system is similar to the test system of FIGS. 1-2 and 3a. Common elements may not be discussed or discussed in detail. In one embodiment, the test system includes a scanning microscope module 110 and a test module 140. Providing the test system with other types of modules may also be useful.

In one embodiment, the test module includes a tester unit 150 and a user interface (UI) 349. The UI provides a user easy control of the test system. For example, the UI facilities in executing testing of ICs by the test system. The UI, for example, is a graphical interface. The UI makes it easy and intuitive for a user to run the test system. For example, the UI facilitates testing a DUT. It is understood that the test systems of FIGS. 1-2 and 3a may also include a UI.

As shown, the test system includes a test pattern 342. In one embodiment, the test pattern includes an original sort test pattern 142. The original sort test pattern, for example, is a 3-Dimensional (3-D) matrix of test vectors corresponding to specific pin names of the IC and cycle numbers.

The test module, in one embodiment, includes a test pattern manipulator. The test pattern manipulator, for example, is a software application which can be initiated using the UI. The test pattern manipulator manipulates the original sort test pattern to generate a technical test pattern 343. For example, the test pattern manipulator manipulates the original sort test pattern based on a reference failure log 145. The reference failure log, for example, contains failing compare vectors of interest.

In one embodiment, a user may employ the UI to initiate the manipulator, which receives the original sort test pattern and reference failure log as inputs. Using the UI, the user may provide inputs to modify the original sort test pattern based on the prior reference failure log. Manipulation includes inverting failed vectors based on reference failure log. Manipulation may also include masking out test vectors from testing. For example, a user may select failing pins and cycles (vectors) to invert as well as which failing vectors to mask out from testing. Using the manipulator, a user may define the failure signature. For example, inverted vectors correspond to the failure signature. The technical test pattern is then generated.

The technical test pattern is employed to test a DUT by the tester. The technical test pattern is employed to test the DUT, similar to that described with testing the DUT with the original sort test pattern. For example, within a test cycle, the laser beam scans the backside of the DUT to perturb the IC one test or pixel location at a time until the whole DUT is tested. At each location or test run, the tester tests the IC with the technical test pattern.

The results of the testing using the technical test pattern is compared with the expected values of the technical test pattern to determine whether the output test vector is a failed test vector. By default, since the technical test pattern involves expected compare states being modified, it will fail in any test. In one embodiment, the tester unit produces a fail if testing using the technical test pattern passes and generates a pulse.

As discussed, the technical test pattern includes inverted failed pins from failed test vectors of interest. Inverting the failed pins of failed test vectors of interest causes any dies to fail the test while a bad die to pass the test. On a good or soft fail die which the laser perturbs during testing, if a fail turns to a pass at a test location, this indicates that the testing produces a failure at the location under test which matches the desired failure signature. The tester unit, in response, generates a trigger pulse to the image processor.

Figure 4A:
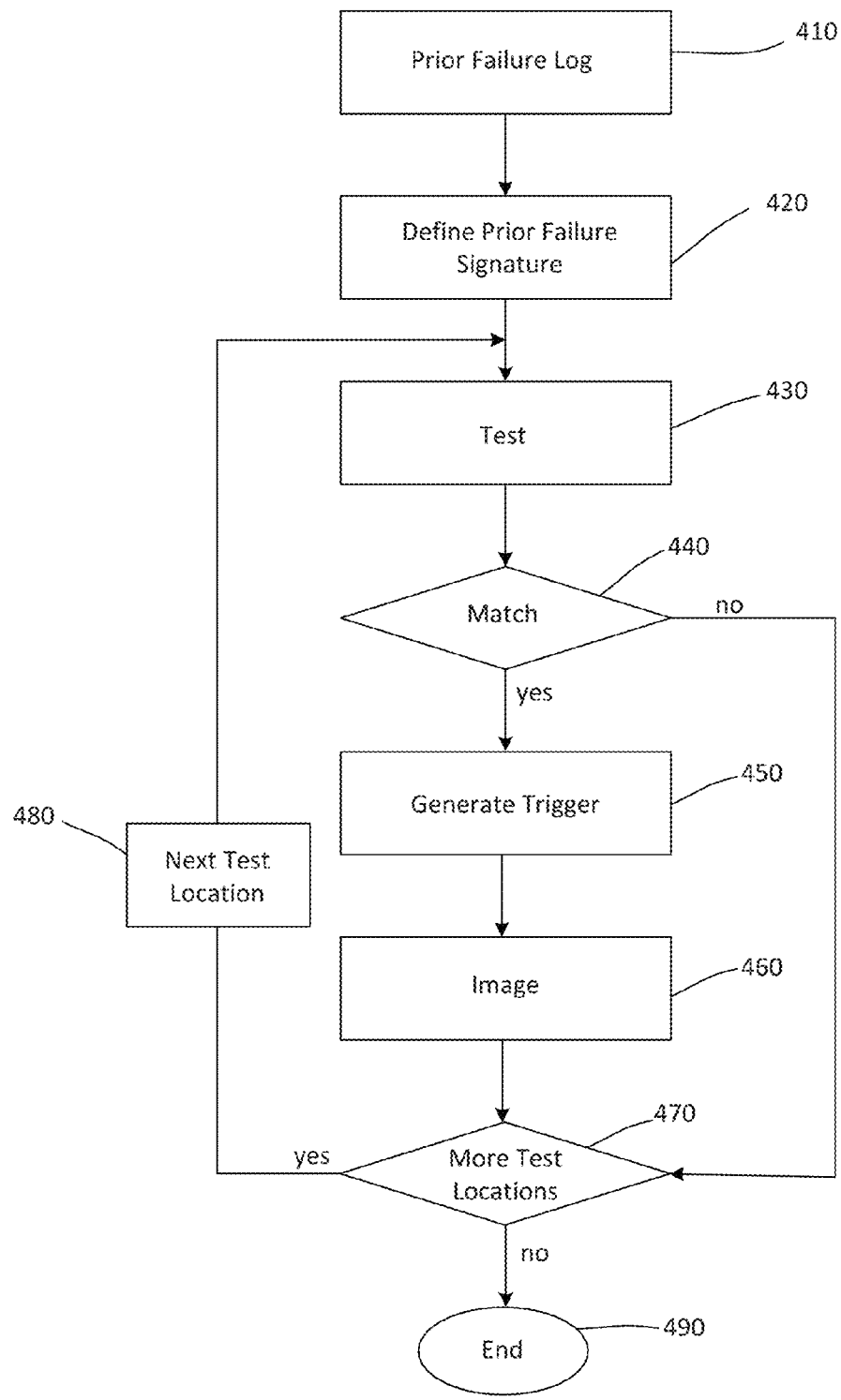
FIGS. 4a-4c show embodiments of test processes.

FIG. 4a shows an embodiment of a process 400 for testing a DUT. For example, the process is employed by a testing system as described in FIGS. 1-2 and 3*a*. As shown, a prior reference failure log is obtained at step 410. The prior reference failure log, for example, is obtained from a sort test of failed ICs. Prior failed vectors from the sort test may be compiled to form the reference failure log. The prior reference failure log may serve as the prior failure reference log unit. From the prior reference failure log, a user may define a prior failure signature at step 420. The prior failure signature may be tailored to a desired test stringency of the user.

At step 430, the tester unit tests a DUT with a test pattern. At a test location or pixel, a test run of the test pattern is performed. In one embodiment, the tester tests the DUT on the fly, as described. The comparator tests an output test vector with a failing compare vector at the test cycle of the test run. For example, the comparator tests an output test vector with a failing compare vector at the exact test cycle or a delay of one cycle of the test run. After the end of the test run, the comparator determines if a failure signature is detected during the test run at step 440. If a failure signature is detected, the tester generates a trigger signal at step 450 to, for example, the image processor. The trigger signal causes a defect signal to be overlaid onto an image of the DUT at the location of the failure at step 460. At step 470, the process determines if there are more test locations to test. If there are, the scanner scans the laser to the next test location at step 480 for testing at step 430. If there are no more test locations to test, the process terminates at step 490.

Figure 4B:
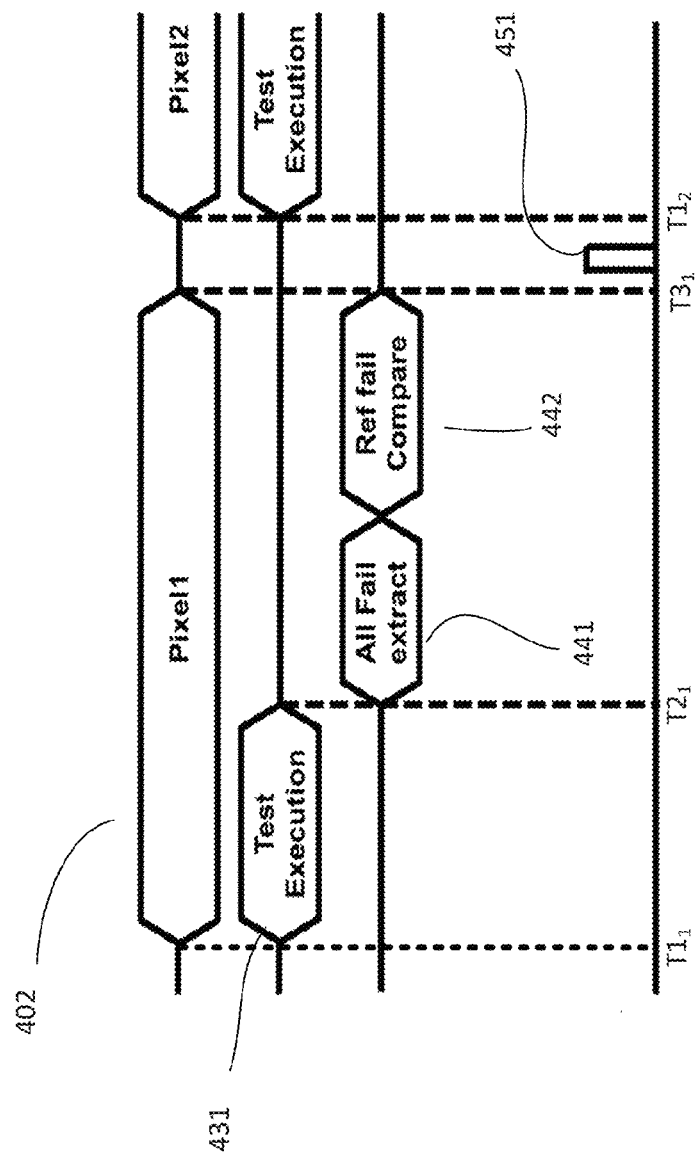

FIG. 4*b* shows a timing diagram of an embodiment of a test process 400*b*. The test process, for example, may be employed by the test system as described in FIGS. 1-2, 3*a* and 4*a*. Common elements may not be described or described in detail.

As shown, the process tests one pixel of the DUT at a time. For example, a first pixel 402 of the DUT is tested at $T1_1$. The testing of the first pixel is from $T1_1$-$T3_1$. The test execution signal 431 of the DUT for the first pixel is initiated at $T1_1$. The testing of the first pixel with the test pattern is completed by $T2_1$. Between $T2_1$ and $T3_1$, the fail vectors 441 are extracted and compared with the defined reference fail log 442. If a match is found, a trigger pulse 451 is generated between $T3_1$ and $T1_2$. Time $T1_2$ initiates testing of the next pixel of the DUT.

Figure 4C:
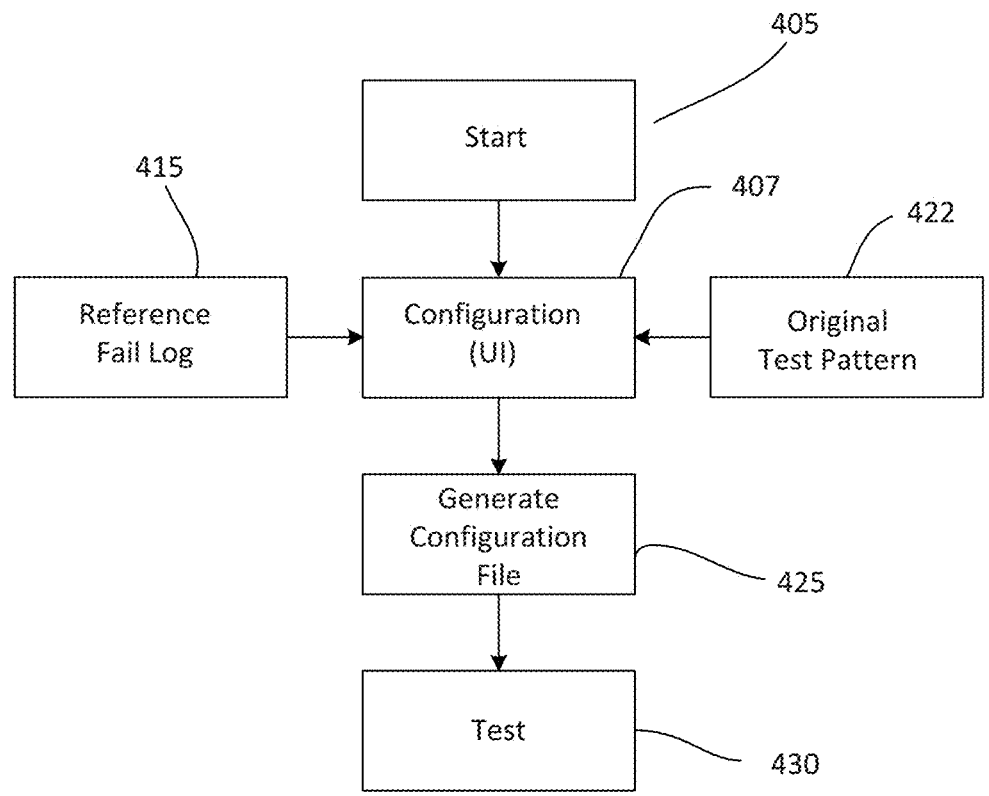

FIG. 4*c* shows another embodiment of a process 400*c* for testing a DUT. As shown, the process shows modifying an original sort test pattern based on a reference fail log and user input using, for example, a UI, as described in FIG. 3*b*. The process may also be similar to that described in FIGS. 1-2, 3*a* and 4*a*-4*b*. Common elements may not be described or described in detail.

At step 405, the testing of a DUT is initiated. For example, a user initiates the test system for testing a DUT. A user may initiate a test of a DUT using, for example, a UI of the tester. At step 407, the user may configure the test pattern for testing the DUT. For example, the user may configure a technical test pattern based on reference fail log 415 and an original sort test pattern 422. For example, the UI may provide various options for the user to generate a technical test pattern based on the reference fail log and original sort test pattern.

The configuration options may include tester unit platform, pattern inversion and masking options. The platform option relates to tester platform selection. For example, a user may be able to configure the technical test pattern for use with a desired tester platform. For example, the technical test pattern may be configured to be used with different types of tester units from different manufactures. The platforms may include Credence, Advantest or Teradyne. Other platform options may also be provided.

Regarding pattern inversion option, it relates to inverting the original sort test pattern based on the reference fail log. The user may select which failed test vectors to invert. For example, the UI may provide the option for a user to select inverting test pins of failed test cycles. For example, a pin, some pins or all pins of the first fail test cycle, the last fail cycle, all fail cycles or desired fail test cycles are inverted. The UI may also enable the user to select inverting no failed cycles. The pattern inversion option enables a user to focus on specific failure signature.

As for the masking option, it allows a user to select which failed vectors to mask out other than those already identified for the inversion process. For example, non-selected failed cycles that belong to the failure signature of interest may be masked. Other compare fail vectors within the test pattern that did not fail or meet the expected state during testing can also be masked. The user may select no vectors to be masked out of the testing process. The masking option enables stringency in determining the signals.

After a user decides how the original sort test pattern is to be manipulated based on the reference failing log, for example, using the UI, the process may modify the original sort test pattern based on the configuration options at step 425. The modification process generates a technical test pattern configured for a selected tester unit platform.

The testing, for example, is similar to that described from steps 430 and onwards in FIG. 4*a* with the exception that no actual matching procedure is required in this case. Running the test using the technical test pattern and monitoring the change in state from fail to pass is an indirect way of 'matching'. In one embodiment, testing includes generating a trigger signal if the test at the test location passes. For example, if testing using the technical test pattern results in a pass, which indicates a test location 'matches' to the failure signature, the trigger signal is generated. The trigger signal causes a defect signal to be overlaid onto an image of the DUT at the location of the failure.

Figure 5:
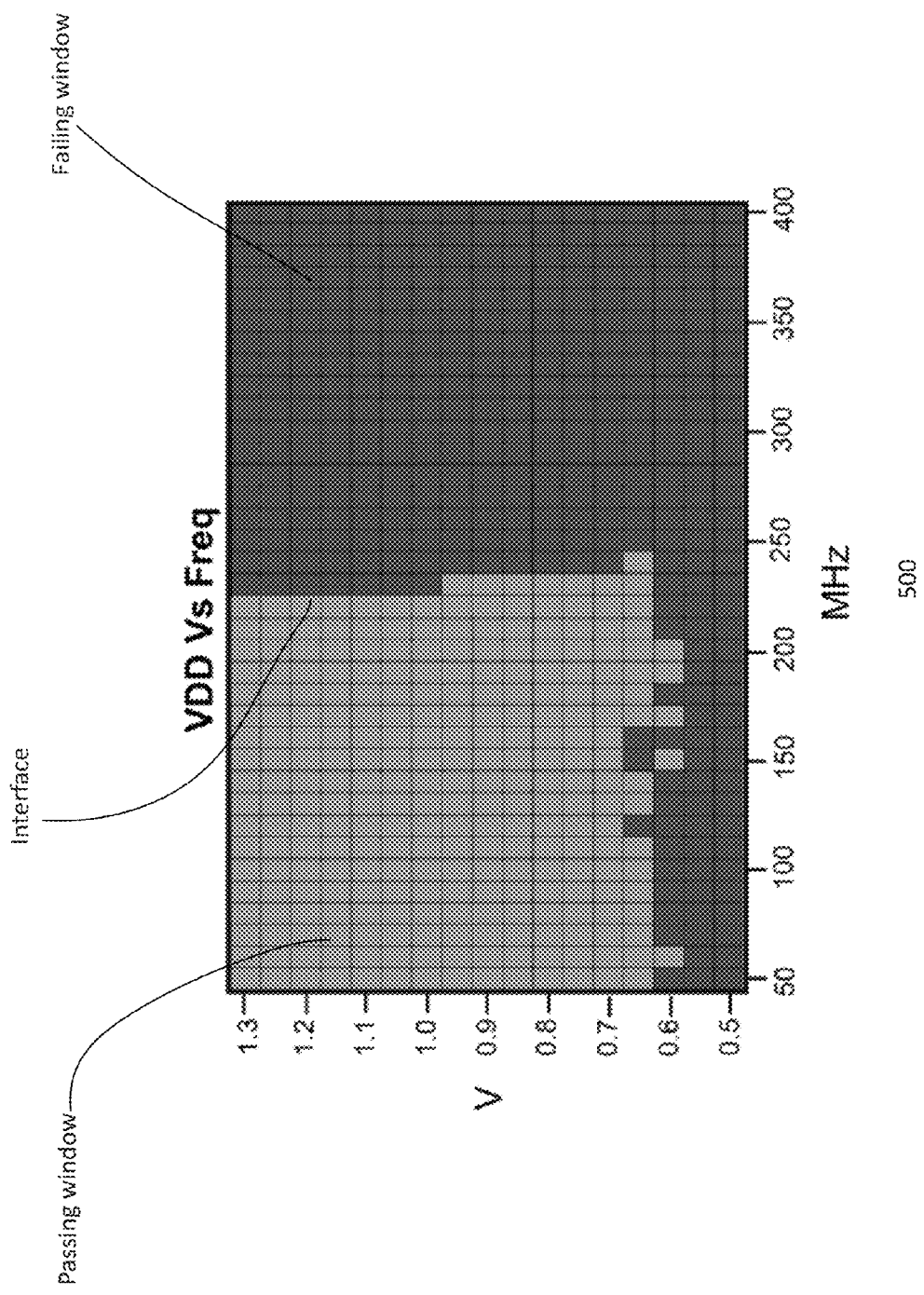
FIG. 5 shows an embodiment of a Shmoo curve.

The tester tests the DUT under desired operating conditions. In one embodiment, the operating conditions are selected based on a Shmoo curve. FIG. 5 shows an exemplary embodiment of a Shmoo curve 500. The Shmoo curve is a 2-Dimensional (2-D) matrix which displays the pass/fail states of a device to be tested under varying test parameters. The test parameters may be, for example, an IC. As shown, the test parameters are power supply voltage (V) and frequency (MHz). Operating conditions which result in the IC displaying a pass state is referred to as a passing window (represented by a first shade) while the operation conditions which result in the IC displaying a fail state is referred to as a failing window (represented by a second shade). The operating conditions for defect testing are generally selected in the passing window at about an interface of the passing/failing windows. Such operating conditions cause sensitive or marginal transistors to fail testing when perturbed by the laser.

Figure 6:
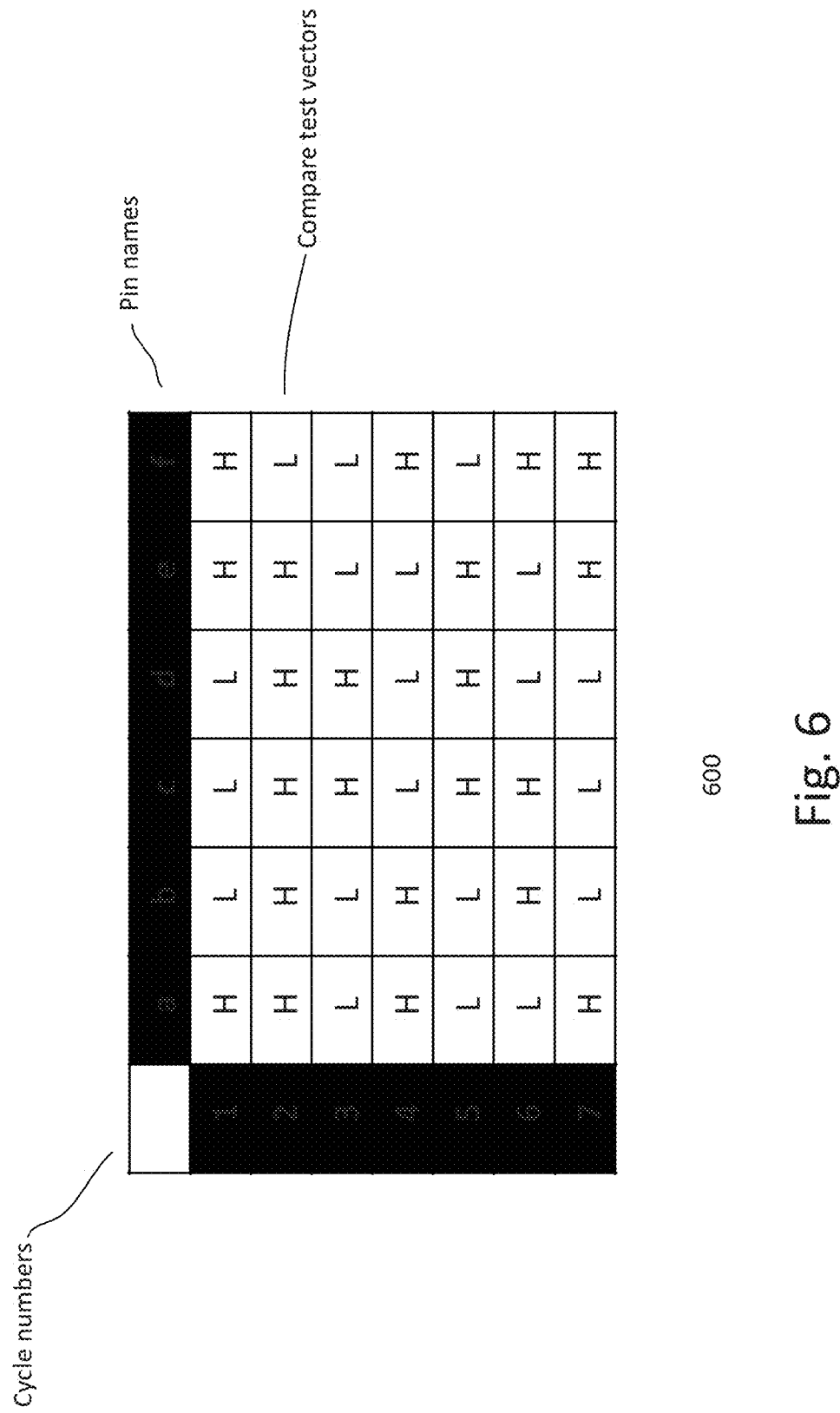
FIG. 6 shows a simplified illustration of a test pattern.

FIG. 6 shows a simplified illustration of a test pattern 600. As shown, the test pattern includes compare test vectors arranged as a matrix with cycle numbers, pin names and expected compare signal states. It is understood that a test pattern may include significantly more vectors, including input signals, such as from a few hundred to tens of thousands of cycles.

Figure 7:
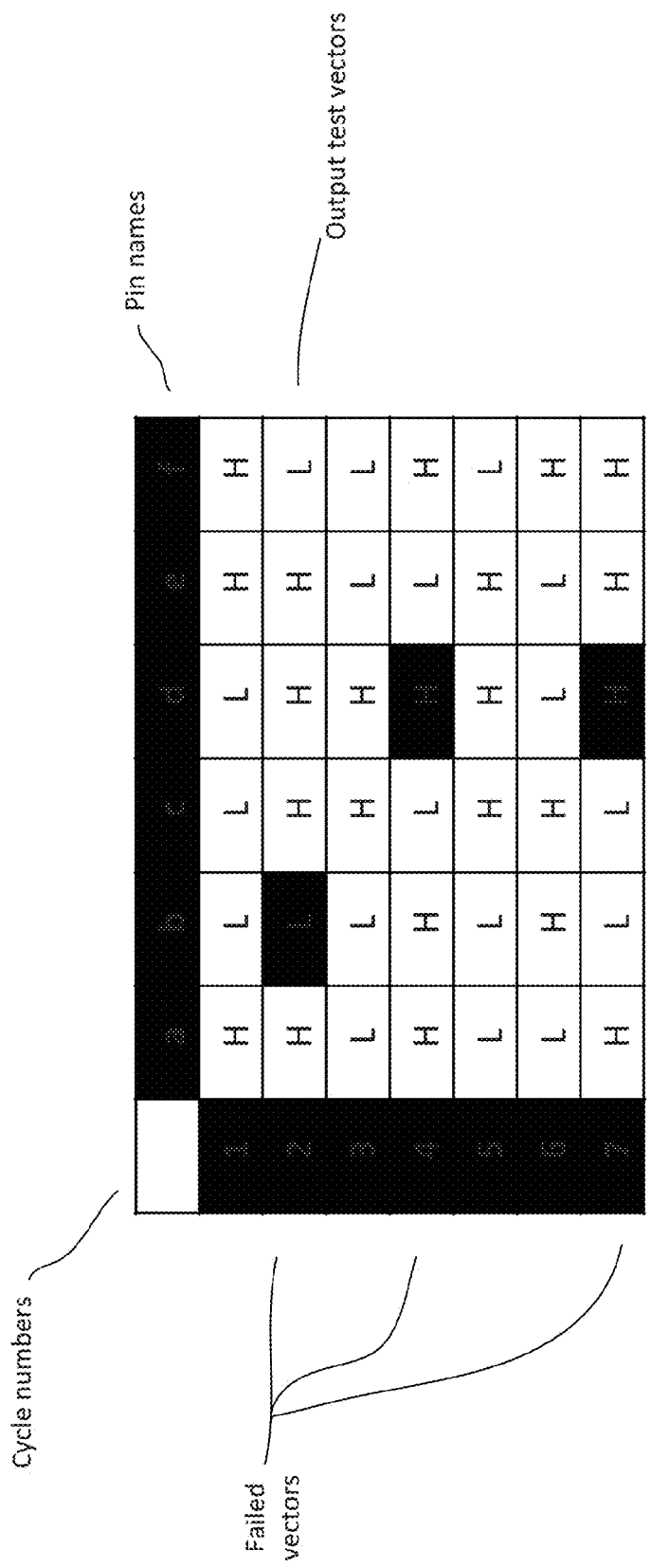
FIG. 7 shows failed test compare vectors from testing with a test pattern.

FIG. 7 shows a simplified illustration of output test vectors 700 from a test run. The output test vectors, when compared with the compare test vectors of FIG. 6, indicate failed signals which are highlighted by the shaded pins.

Figure 8A:
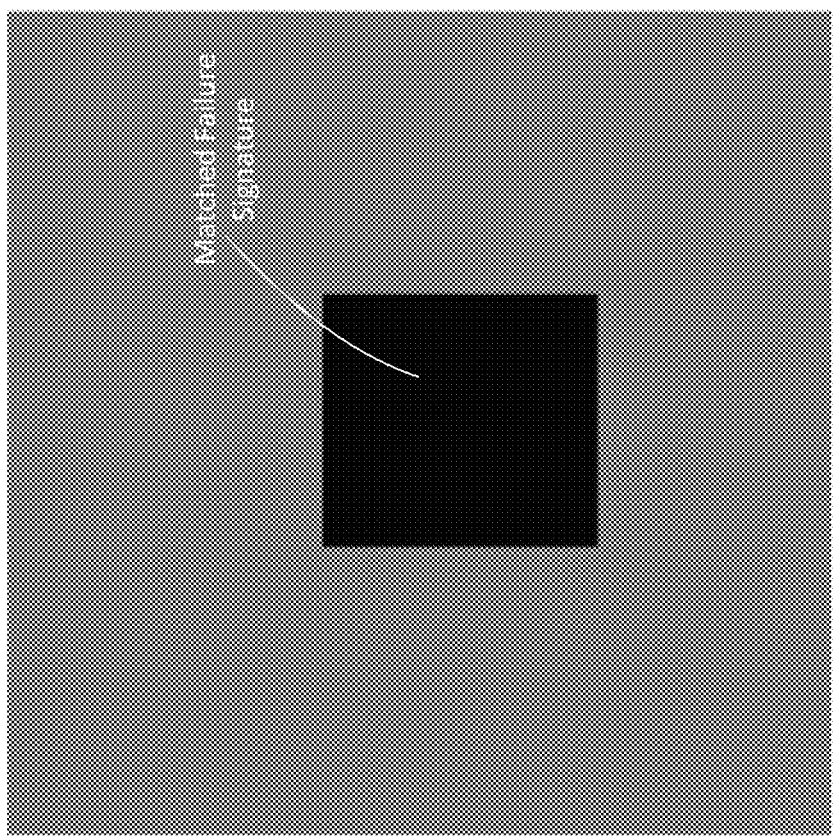
FIG. 8a shows an image of a failed location.
Figure 8B:
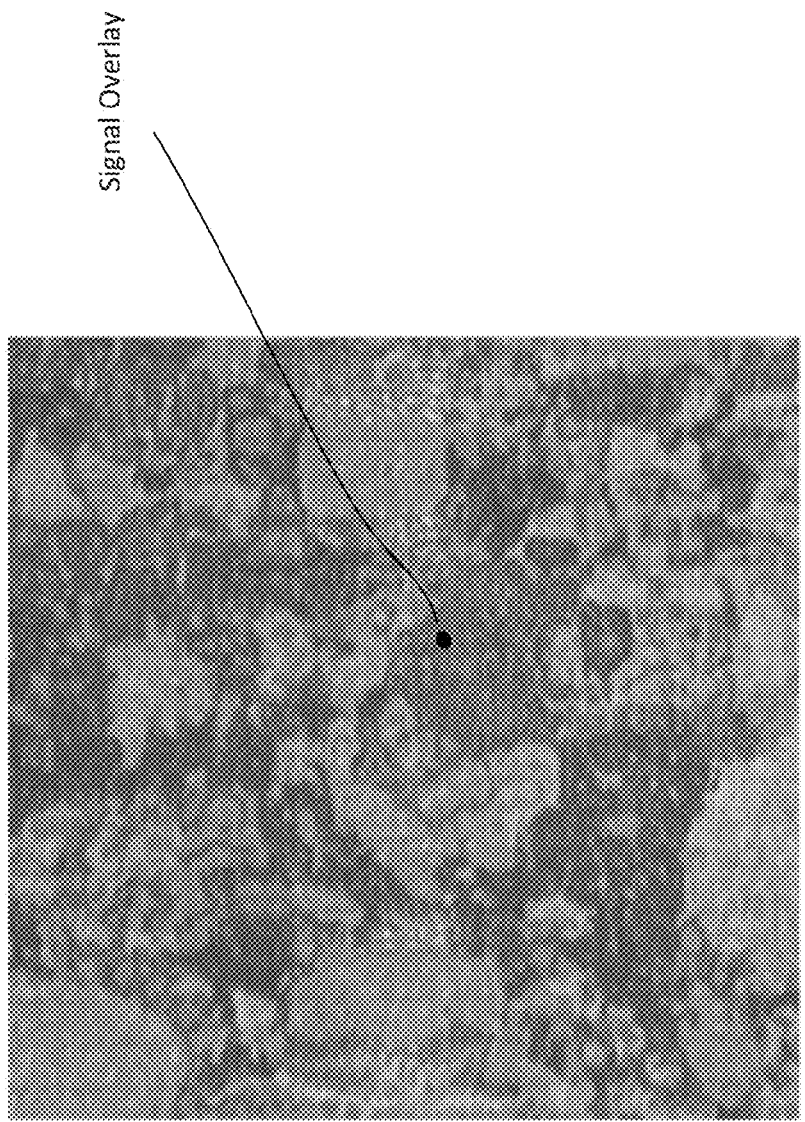
FIG. 8b shows an image of an IC with an overlaid failed location.

FIG. 8a shows an image 800 from the tester. The image includes a signal of a test site which matches a defined failure signature. For example, the test run of the location results in failed vectors which match a defined failure signature. The electrical signal is an electrical sample of the trigger pulse. FIG. 8b shows the signal of the failed test site overlaid onto an image 810 of the DUT.

Figure 9A:
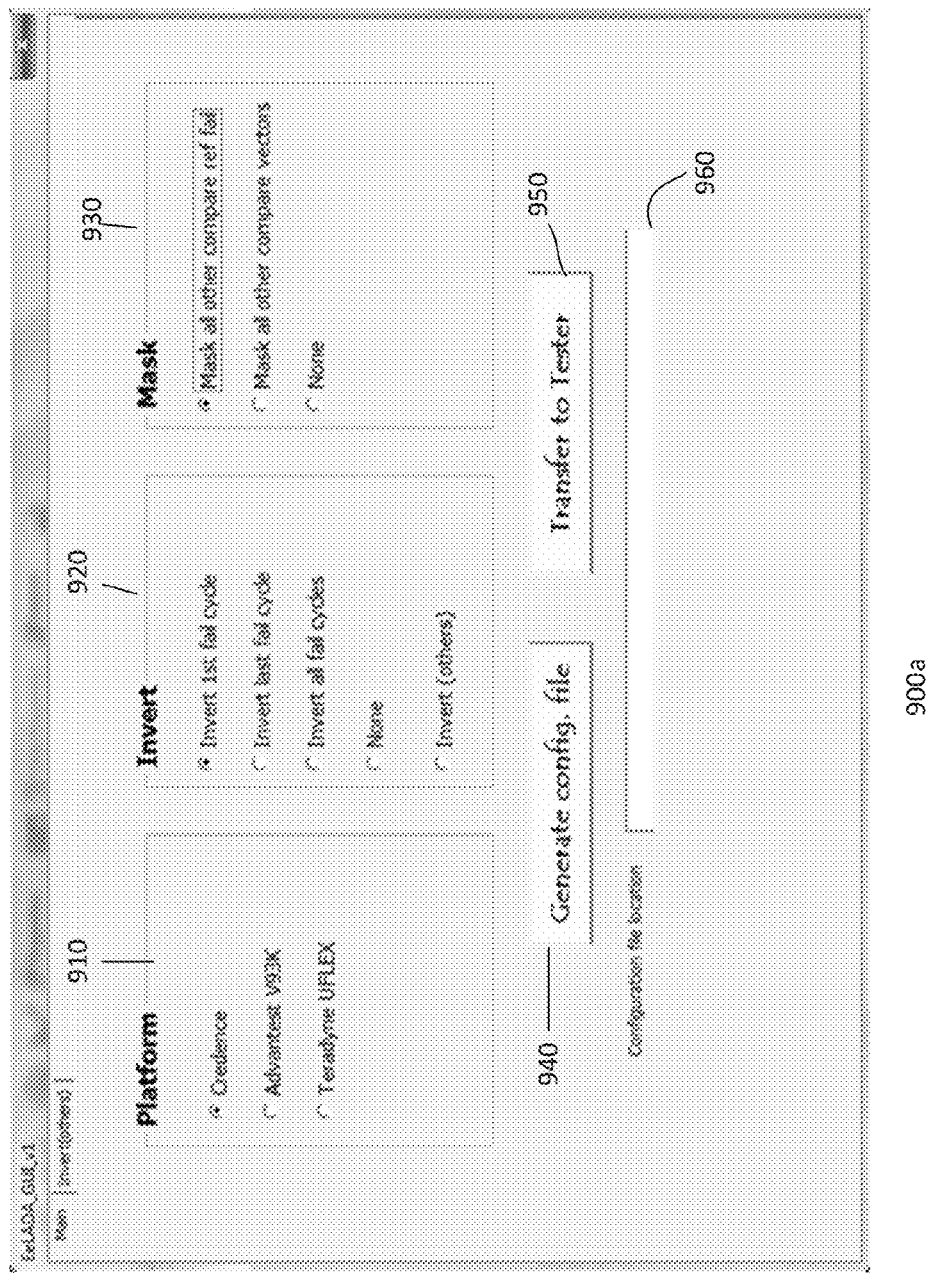
FIGS. 9a-9b show exemplary user interfaces of a test controller.
Figure 9B:
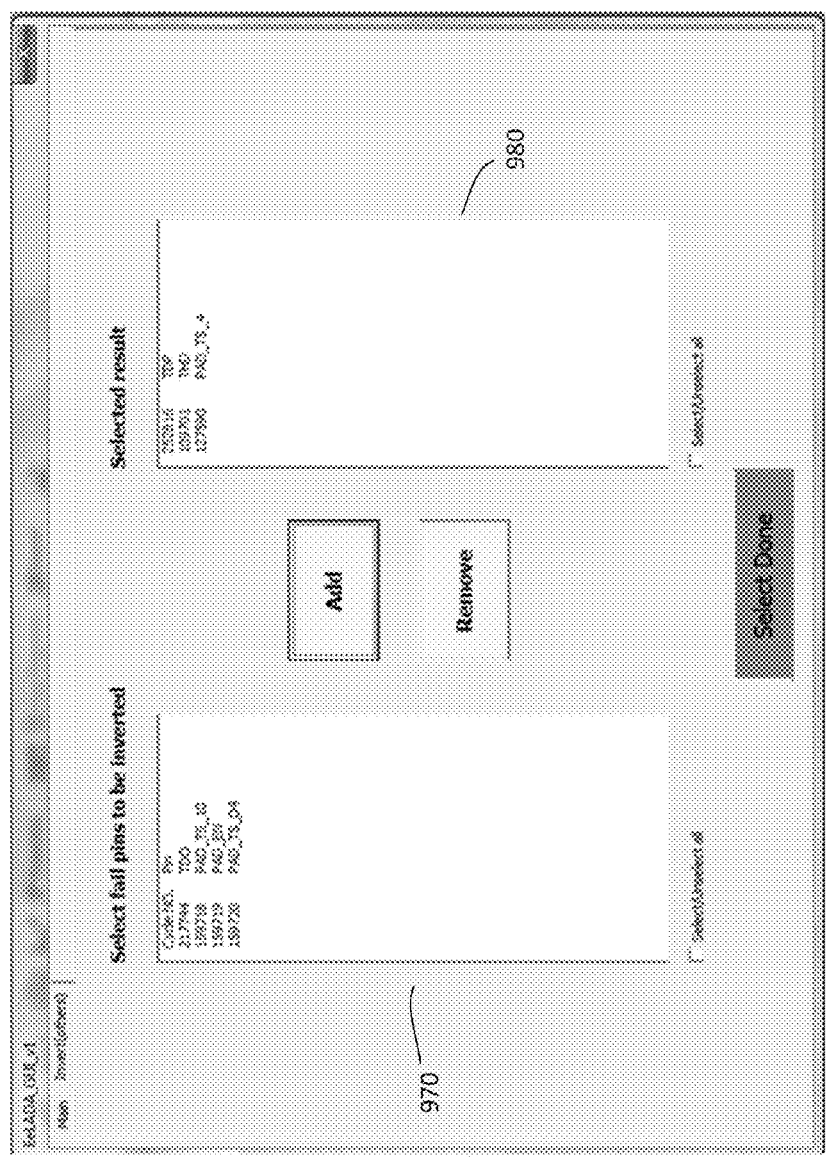

FIGS. 9a-9b show screen shots of an exemplary embodiment of a UI for configuring a test pattern for testing a DUT. Referring to FIG. 9a, a UI page 900a for generating a configuration file is shown. The UI configuration page, in one embodiment, includes a tester unit platform select option 910, a pattern inversion select option 920 and a masking select option 930. The UI configuration page may also include a generate configuration file command button 940, a transfer to tester unit command button 950 and location option 960 where the configuration file is to be stored. Other options or items may also be provided in the configuration UI page.

Using the UI configuration page, a user may select the tester unit platform with which the configuration file is to be used. For example, as shown, the user may select Credance, Advantest or the Teradyne platform from the platform select option. Additional or other platform options may also be provided. The user may choose which fail cycles to select for pattern inversion using the pattern inversion select option. As shown, a user may select to invert the pins within the first fail cycle, the last fail cycle, all fail cycles, no fail cycle or specific fail cycles. The mask select option enables a user to mask out certain failed vectors or all the non-failed compare vectors from testing.

After the configuration options are selected, the user may generate the configuration file by, for example, clicking on the generate configuration file. The user may indicate the location to which the configuration file is to be saved using the location option. Additionally, the user may transfer the configuration file to the tester system by clicking on the transfer to tester command.

FIG. 9b shows a UI pin selection page 900b. The UI pin selection page may be presented to the user when the "other" inversion option is selected in the UI configuration page. The UI pin selection page enables a user to select individual fail pins/cycles to invert. For example, a pin display panel 970 provides a list of fail pins/cycles that can be inverted. The list of fail pins/cycles, for example, is from the reference fail log. Using this list a user can decide which pins of failed vectors to invert. The user may select a pin/cycle by clicking on the pin/cycle and add command button. This causes the selected failed pin to be added to the selected result display panel 980. For example, as shown, the user selected 3 failed pins from the pin display panel. The selected failed pins are transferred to the selected result display panel. After a user has completed selecting the desired failed pins to invert, the done command button may be clicked. This returns the user to the UI configuration page of FIG. 9a.

Figure 10A:
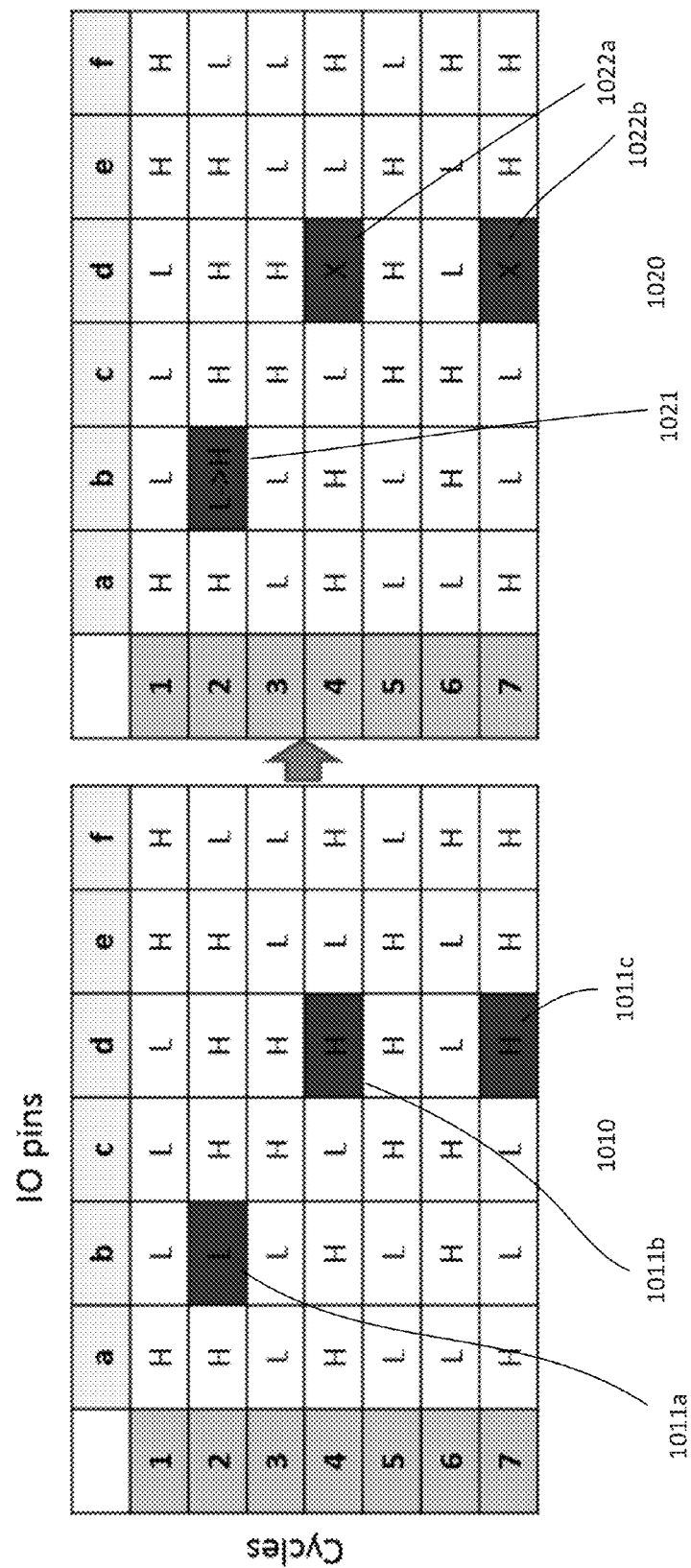
FIGS. 10a-10b show different vector modification configurations.
Figure 10B:
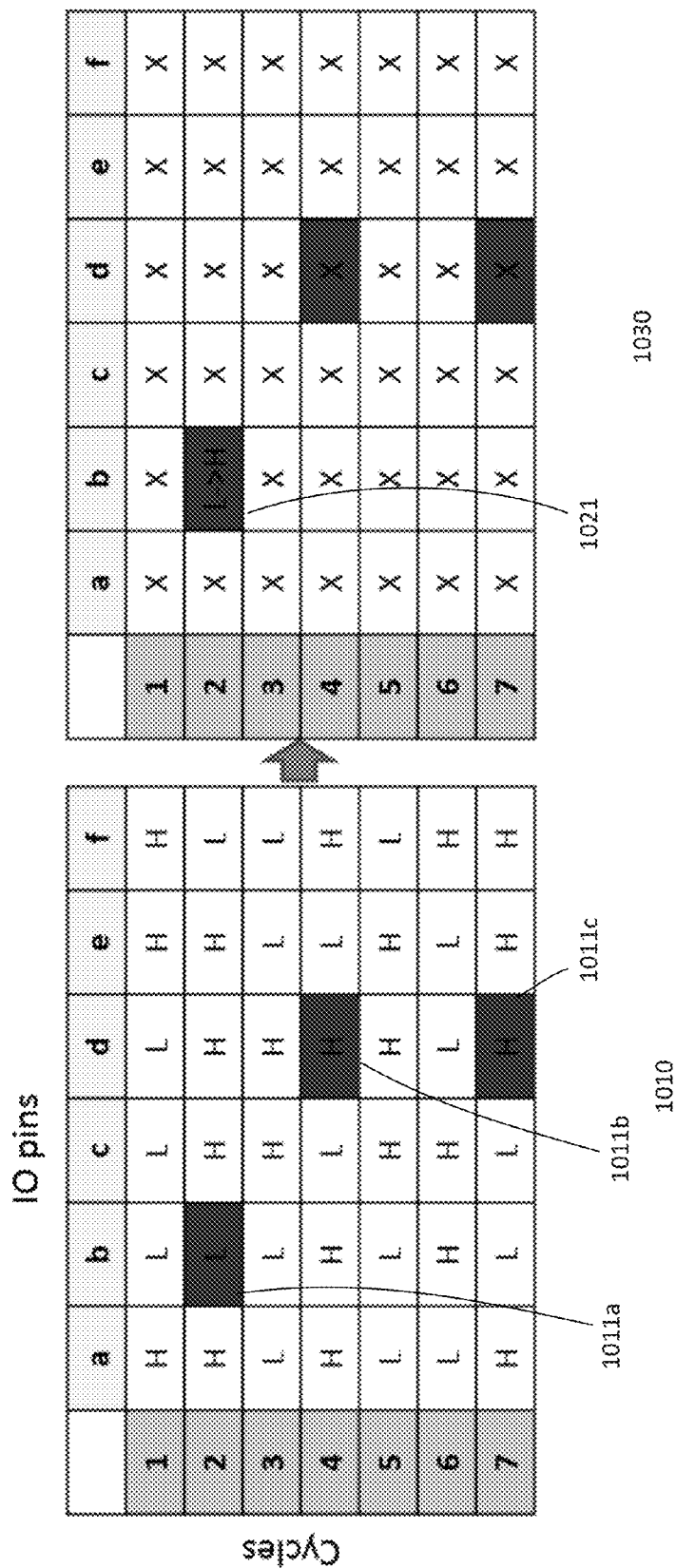

FIGS. 10a-10b show embodiments of original sort test and technical test vectors respectively. Referring to FIG. 10a, compare test vectors 1010 is shown. The compare test vector shows, for example, 7 test cycles with 6 I/O pins (a-f). From the compare test vectors, there are 3 failed cycles (cycles 2, 4 and 7). For example, the expected value of pin b in cycle 2 (1011a) should be L, while pin d of cycles 4 and 7 (1011b and 1011c) should be H. Using the UI, a user may configure the technical test vector 1020 by selecting the invert first failed cycle and mask other compare fail vectors. In such case, pin b of the second cycle (1021) is inverted to a H while pin d of cycles 4 and 7 (1022a and 1022b) are masked (as indicated by x or don't care). The technical test vector is used for testing the DUT.

Referring to FIG. 10b, a compared test vector 1010 is shown. The compare vector is similar to that shown in FIG. 10a. For example, the compare vector includes 3 failed cycles (cycles 2, 4 and 7). For example, the expected value of pin b in cycle 2 (1011a) should be L, while pin d of cycles 4 and 7 (1011b and 1011c) should be H. Using the UI, a user may configure the technical test vector 1030 by selecting the invert first failed cycle and mask all other compare vectors. In such case, pin b of the second cycle (1021) is inverted to a H while all other pins are masked (as indicated by x or don't care). The technical test vector is used for testing the DUT.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A test system for testing devices comprising:
   a scanning microscope module, the scanning microscope module, when testing a device under test (DUT), is configured to perturb the DUT with a laser at a test (pixel) location; and
   a test module, the test module comprises
      a tester unit,
      a user interface (UI), wherein the UI is a graphical interface is configured to initiate a test pattern manipulator, wherein the UI comprises a UI configuration page for generating a configuration file and a UI pin selection page, the test pattern manipulator generates a manipulated test pattern from a test pattern,
      a reference failure log containing prior failing compare vectors of interest,
      a comparator unit, wherein the comparator unit comprises a software comparator, and
      wherein the tester module is configured to
         perform a test run at a test location of the DUT with the manipulated test pattern,
         if the test run fails testing,
         compare using the comparator unit to determine if failing test vectors of the test run matches a desired failure signature, and
         generate a comparator trigger pulse if failing test vectors match the desired failure signature, the trigger pulse indicates that the test location of the DUT is a failed location.

2. The test system of claim 1 wherein the scanning microscope module comprises:
   a stage for mounting the DUT when testing the DUT;
   a laser source unit for generating a beam;
   a scanner unit for scanning the beam across the DUT;
   a focusing unit for focusing the beam onto a backside of the DUT;
   a photodetector unit for detecting a reflected beam from the DUT and generating a photodetector output signal; and
   an image processing unit for processing the photodetector output signal to generate a reflected image of the DUT.

3. The system of claim 2 wherein the failure signal is overlaid onto the reflected image of the DUT at the test location of the DUT corresponding to a trigger pulse.

4. The system of claim 1 wherein the comparator unit is integrated with the tester unit.

5. A test system for testing devices comprising:
a scanning microscope module, the scanning microscope module, when testing a device under test (DUT), is configured to perturb the DUT with a laser at a test (pixel) location;
a test module, the test module comprises
a tester unit,
a user interface (UI), wherein the UI is a graphical interface, and
a reference failure log containing prior failing compare vectors of interest; and
a test pattern, wherein the test pattern includes an original sort test pattern which is a 3-Dimensional (3-D) matrix of test vectors corresponding to specific pin names and cycle numbers.

6. The system of claim 5 wherein the test module comprises a test pattern manipulator, wherein the test pattern manipulator is a software application which can be initiated using the UI.

7. The system of claim 6 wherein the test pattern manipulator manipulates the original sort test pattern to generate a technical test pattern.

8. The system of claim 7 wherein the test pattern manipulator manipulates the original sort test pattern based on the reference failure log which contains failing compare vectors of interest.

9. The system of claim 6 wherein the UI receives the original sort test pattern and reference failure log as inputs.

10. The system of 9 wherein the inputs are provided by users to modify the original sort test pattern based on prior reference failure log.

11. The system of 10 wherein the test pattern manipulator manipulates manipulations to define failure signature and generate a technical test pattern, wherein the manipulations comprise
inverting failed vectors based on the reference failure log; and
masking out test vectors from testing.

12. The system of 11 wherein the technical test pattern is employed to test the DUT by the tester unit.

13. The system of claim 1 wherein the tester unit produces a fail signal if testing using the technical test pattern passes and generates a trigger pulse.

14. A method of testing a device under test (DUT) comprising:
providing a tester unit;
providing a user interface (UI) to initiate a test pattern manipulator to manipulate an original sort test pattern to generate a technical test pattern, wherein the UI comprises a UI configuration page for generating a configuration file and a UI pin selection page;
providing a reference failure log containing prior failing compare vectors of interest;
providing a comparator unit, wherein the comparator unit comprises a software comparator; and
testing the DUT using the manipulated test pattern,
wherein the testing comprises testing at a test location by
perturbing the DUT at the test location with a laser,
performing a test run at the test location with the manipulated test pattern,
if the test run fails testing,
comparing test vectors to determine if failing test vectors of the test run matches a desired failure signature, and
generating a trigger pulse if failing test vectors match the desired failure signature, the trigger pulse indicates that the test location of the DUT is a failed location.

15. The method of claim 14 wherein the reference failure log is obtained from a sort test.

16. The method of claim 15 wherein comparing the test vectors comprises comparing corresponding test vectors with failing compare vectors of the reference failure log.

17. The method of claim 14 wherein the UI configuration page comprises
a tester unit platform select option;
a pattern inversion select option; and
a masking select option.

18. The method of 17 wherein the UI configuration page further comprises
a generate configuration file command button;
a transfer to tester unit command button; and
location option where a configuration file is to be stored.

19. The method of 18 comprises
selecting the tester unit platform with which the configuration file is to be used using the UI configuration page;
generating the configuration file;
indicating a saving location; and
transferring the configuration file to a tester system.

20. The method of claim 14 wherein the UI pin selection page enables a user decide which pins of failed vectors to invert and select individual fail pins/cycles to invert.

* * * * *